(12) United States Patent
Taniguchi et al.

(10) Patent No.: US 9,124,238 B2
(45) Date of Patent: Sep. 1, 2015

(54) DUPLEXER

(71) Applicant: TAIYO YUDEN CO., LTD., Tokyo (JP)

(72) Inventors: Noriaki Taniguchi, Kanagawa (JP);
Toshio Nishizawa, Kanagawa (JP)

(73) Assignee: TAIYO YUDEN CO., LTD., Tokyo (JP)

(*) Notice: Subject to any disclaimer, the term of this patent is extended or adjusted under 35 U.S.C. 154(b) by 363 days.

(21) Appl. No.: 13/655,046

(22) Filed: Oct. 18, 2012

(65) Prior Publication Data

US 2014/0111286 A1    Apr. 24, 2014

(51) Int. Cl.
*H03H 9/72* (2006.01)
*H03H 9/64* (2006.01)
*H03H 9/05* (2006.01)
*H03H 9/70* (2006.01)

(52) U.S. Cl.
CPC ........... *H03H 9/0566* (2013.01); *H03H 9/6476* (2013.01); *H03H 9/706* (2013.01); *H03H 9/725* (2013.01)

(58) Field of Classification Search
CPC ... H03H 9/0566; H03H 9/6476; H03H 9/706; H03H 9/725; H03H 9/72; H03H 9/64; H03H 9/05
USPC ............ 333/133, 193, 195; 310/340; 257/690
See application file for complete search history.

(56) References Cited

U.S. PATENT DOCUMENTS

| | | | | |
|---|---|---|---|---|
| 5,859,473 A | * | 1/1999 | Ikata et al. | 257/723 |
| 2005/0242903 A1 | | 11/2005 | Inoue et al. | |

FOREIGN PATENT DOCUMENTS

| | | |
|---|---|---|
| JP | 2005-318307 A | 11/2005 |
| JP | 2008-271230 A | 11/2008 |

* cited by examiner

*Primary Examiner* — Benny Lee
*Assistant Examiner* — Albens Dieujuste
(74) *Attorney, Agent, or Firm* — Chen Yoshimura LLP (57) ABSTRACT

Provided is a duplexer that can maintain isolation characteristics while being able to independently adjust the input/output ground inductances and the common ground inductance of the double-mode filter. The duplexer includes: a transmitting filter; a receiving filter; a package substrate that includes a first substrate, a die attach layer that is patterned onto the first substrate, a second substrate, and an inner layer located between the first substrate and the second substrate; a double-mode filter that constitutes a portion of the receiving filter; a common ground terminal that makes an input ground and an output ground of the double-mode filter commonly grounded, the common ground terminal constituting a portion of the die attach layer; an input-side ground terminal of the double-mode filter, the input-side ground terminal constituting a portion of the inner layer; and an output-side ground terminal of the double-mode filter, the output-side ground terminal constituting a portion of the inner layer and being formed separately from the input-side ground terminal.

20 Claims, 8 Drawing Sheets

Change In Isolation Characteristics Due to Separating Only The Inner Layer Pattern

DUPLEXER

The present application hereby incorporates by reference Japanese Application No. 2011-220700, filed in Japan on Oct. 5, 2011 in its entirety.

TECHNICAL FIELD

The present invention relates to a duplexer used in a wireless device such as a mobile telephone.

BACKGROUND ART

In recent years, mobile telephones, mobile data devices, and the like have spread rapidly with the development of mobile communication systems. In addition to mobile telephones rapidly developing towards being multiband and multimode, wireless interfaces such as wireless LAN, Bluetooth (trademark), and GPS are increasingly included in mobile telephones, and the miniaturization and integration of the RF circuit in mobile telephones is in strong demand. In this situation, miniaturization and higher performance is increasingly demanded of the duplexer, which is used as an antenna duplexer or the like and is an important component in the RF circuit.

The duplexer, which is used as an antenna duplexer or a branching filter, separates the received signal and transmission signal, which differ in frequency, by relying on the difference in impedance. If there is one type of the transmission signal and one type of the received signal, then the duplexer is provided with one transmitting filter and one receiving filter. There is a possibility of having three or more filters, and in a case in which there are three filters, for example, the device is called a triplexer, but in the present application, all such devices are referred to as a duplexer. A one-port resonator is often used for these filters. Recently, as stated in Patent Document 1, a miniature film bulk acoustic wave resonator (FBAR) or a surface acoustic wave (SAW) resonator is often used instead of the previously widely used dielectric resonators, which are large in size.

The surface acoustic wave resonator is constituted of an interdigital transducer (IDT) that is connected to an input terminal and an output terminal on a piezoelectric substrate, and, if necessary, reflectors disposed on both sides of the IDT. The IDT and the reflectors are made of a metal such as aluminum (Al).

RELATED ART DOCUMENTS

Patent Documents

Patent Document 1: Japanese Patent Application Laid-Open Publication No. 2008-271230
Patent Document 2: Japanese Patent Application Laid-Open Publication No. 2005-318307

SUMMARY OF THE INVENTION

Problems to be Solved by the Invention

Based on the above-mentioned background, as the duplexer has become miniaturized, signal leaks from the transmitting terminal to the receiving terminal have increased, leading to a deterioration in isolation characteristics. In addition, in order to fulfill the demand for an even higher performance for custom products, a duplexer with a high degree of flexibility in design such as being able to independently adjust the various electrode patterns in the duplexer is sought after.

In the technique disclosed in Patent Document 1, the ground pattern of the receiving filter is separated from other patterns, which improves isolation characteristics. Also, in the technique disclosed in Patent Document 2, input and output ground patterns of a filter are separated from each other on a die attach layer, by which an attempt is made to improve the balance characteristics of the balanced output filter and reduce the ground inductance.

However, even if these techniques were combined, it was not possible to obtain a duplexer that could independently adjust the input ground inductance, the output ground inductance, and the common ground inductance, which is shared by both the input and the output, of a double-mode filter while maintaining isolation characteristics.

The present invention takes into account the above-mentioned problem, and an object thereof is to provide a duplexer that can independently adjust the input ground inductance, the output ground inductance, and the common ground inductance of a double-mode filter while maintaining isolation characteristics.

Means for Solving the Problems

The present invention is a duplexer that includes: a transmitting filter connected between an antenna terminal and a transmitting terminal; a receiving filter disposed between the antenna terminal and a receiving terminal; a package substrate that has a first substrate, a die attach layer that is patterned onto the first substrate, a second substrate, and an inner layer located between the first substrate and the second substrate; a double-mode filter that constitutes a portion of the receiving filter; a common ground terminal that makes an input ground and an output ground of the double-mode filter commonly grounded, the common ground terminal constituting a portion of the die attach layer; an input-side ground terminal of the double-mode filter, the input-side ground terminal constituting a portion of the inner layer; and an output-side ground terminal of the double-mode filter, the output-side ground terminal being formed separately from the input-side ground terminal and constituting a portion of the inner layer. According to the present invention, it is possible to independently adjust the input ground inductance, the output ground inductance, and the common ground inductance of the double-mode filter while maintaining isolation characteristics.

In the above-mentioned configuration, the input-side ground terminal and the output-side ground terminal of the double-mode filter in the inner layer may be separated by a slit.

In the above-mentioned configuration, the double-mode filter may be divided into a plurality of parallel parts. According to this configuration, it is possible to achieve a duplexer that has, as a main component, a filter with a high withstand voltage and a low insertion loss even when used with high frequencies.

In the above-mentioned configuration, the double-mode filter may be disposed so as to overlap with at least a portion of the slit. According to this configuration, the flexibility of design of the ground pad on the receiving filter is greater, and a chip layout for adjusting the inductance of the input/output grounds of the double-mode filter to an appropriate value can be adjusted with greater ease.

In the above-mentioned configuration, the receiving filter may have bumps for connecting to a plurality of ground terminals, and the bumps for connecting to the ground terminals may be formed so as to overlap with at least a portion of the input-side ground terminal or the output-side ground terminal, and so as not to overlap with the slit. According to this configuration, it is possible to prevent a deterioration of coplanarity (flatness) of the package substrate.

In the above-mentioned configuration, a seal ring part may be formed on an outer edge of the first substrate, and the seal ring part may have a common ground with a ground of the transmitting filter and/or the ground of the receiving filter. According to this configuration, electromagnetic shielding effects can be attained and thus the duplexer is not susceptible to external interference from other electronic parts and the like during use.

In the above-mentioned configuration, a seal ring part may be formed on an outer edge of the first substrate, and the seal ring part may be electrically independent of a ground of the transmitting filter and a ground of the receiving filter. According to this configuration, it is possible to prevent the deterioration of device characteristics due to capacitive coupling or the like that occurs when the ground level is low.

In the above-mentioned configuration, the receiving filter may have a balanced output. According to this configuration, a duplexer with a receiving filter having one input and two outputs can be attained.

In the above-mentioned configuration, the receiving filter may have a ladder filter provided with a series resonator and a parallel resonator, and a ground of the parallel resonator and a ground of the double-mode filter are separate in the die attach layer. According to this configuration, in a case in which a ladder filter is included in the receiving filter, the ground inductance of the parallel resonator can be adjusted independently.

Effects of the Invention

According to the present invention, a duplexer that can independently adjust the input ground inductance, the output ground inductance, and the common ground inductance, which is shared by both the input and the output, of a double-mode filter while maintaining isolation characteristics can be attained.

DETAILED DESCRIPTION OF EMBODIMENTS

Embodiment 1

Figure 1:
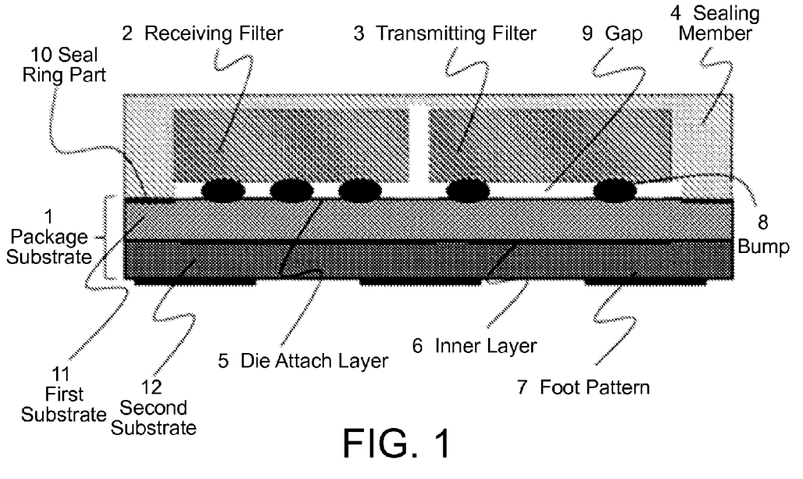
FIG. 1 is a cross-sectional view of a duplexer according to Embodiment 1 of the present invention.
Figure 2A:
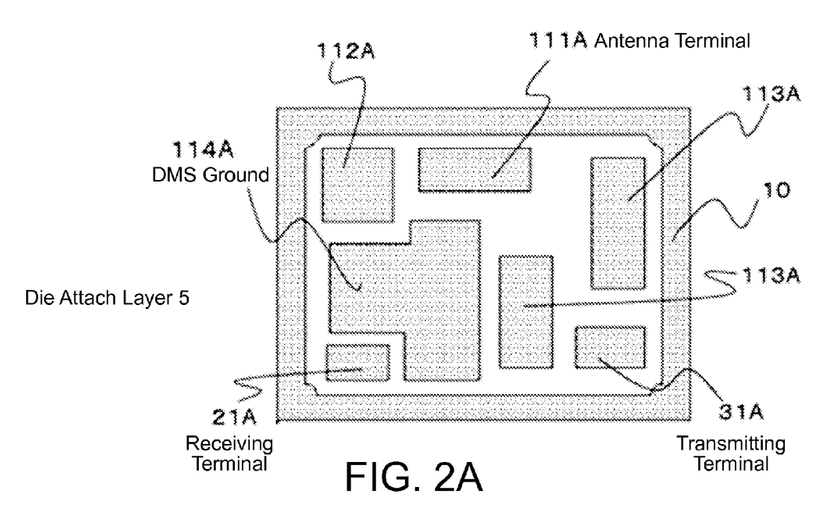
FIGS. 2A-2C are drawings for describing the pattern of each layer of a package substrate of the duplexer of Embodiment 1.

The cross-sectional configuration of the duplexer according to Embodiment 1 is shown in FIG. 1. The cross-section corresponds to the cross-section along the line A-A' of FIG. 6, which will be described below. As shown in FIG. 1, the duplexer of Embodiment 1 has a basic structure in which a receiving filter 2 and a transmitting filter 3 are mounted by the flip chip method on a package substrate 1 with bumps 8 interposed therebetween, and the duplexer is sealed by a sealing member 4. The receiving filter 2 and the transmitting filter 3 may be made of one chip or a plurality of chips. More specifically, the package substrate 1 is constituted of a first substrate 11 and a second substrate 12, and an electrode pattern of a die attach layer 5 and a seal ring part 10 are formed on a filter mounting surface of the first substrate 11, an electrode pattern of an inner layer 6 is formed between the first substrate 11 and the second substrate 12, and a foot pattern 7 for external connection is formed on the rear surface of the second substrate 12. The first substrate 11 and the second substrate 12 are made of an alumina ceramic, a glass ceramic, a resin, or the like. In the present embodiment, the thickness of the first substrate is 100 μm, and the thickness of the second substrate is 51 μm. The size of the duplexer is 2.0 mm×1.6 mm with a thickness of 0.58 mm. In the present embodiment, the package substrate 1 is a two-layered substrate but if a more complex electric circuit is necessary, a substrate with three or more layers may be configured. The die attach layer 5, the inner layer 6, and the foot pattern 7 are made of a conductive member such as copper or aluminum, and are electrically connected to each other through a plurality of vias that are selectively disposed in the first substrate 11 and the second substrate 12 while penetrating the respective substrates, although this is omitted from the drawings. The first substrate 11 and the second substrate 12, which have those conductive layer patterns, are stacked to form a single component, thereby constituting the package substrate 1. The receiving filter 2 and the transmitting filter 3 are mounted by the flip chip method onto the die attach layer 5 with the plurality of bumps 8 made of solder or the like interposed therebetween, and the filters are electrically connected to the package substrate 1. The receiving filter 2 and the transmitting filter 3 are sealed by the sealing member 4 so as to form a gap 9 between the filters and the package substrate 1, in order to secure a space where functional elements such as resonators made of IDT or the like can be excited. The seal ring part 10 is formed in the same layer as the die attach layer so as to surround the die attach layer. In FIG. 2A, which will be described below, the seal ring part 10 is shown to completely surround the die attach layer 5 without any gaps, but notches may be formed therein, or the seal ring part 10 may be formed as a dotted line or an alternating short and long dash line. The seal ring part 10 is made of a metal, for example. The sealing member 4 is made of a resin or a metal, for example. If the sealing member 4 is made of a resin, it is preferable that the seal ring part 10 not be formed.

Figure 2B:
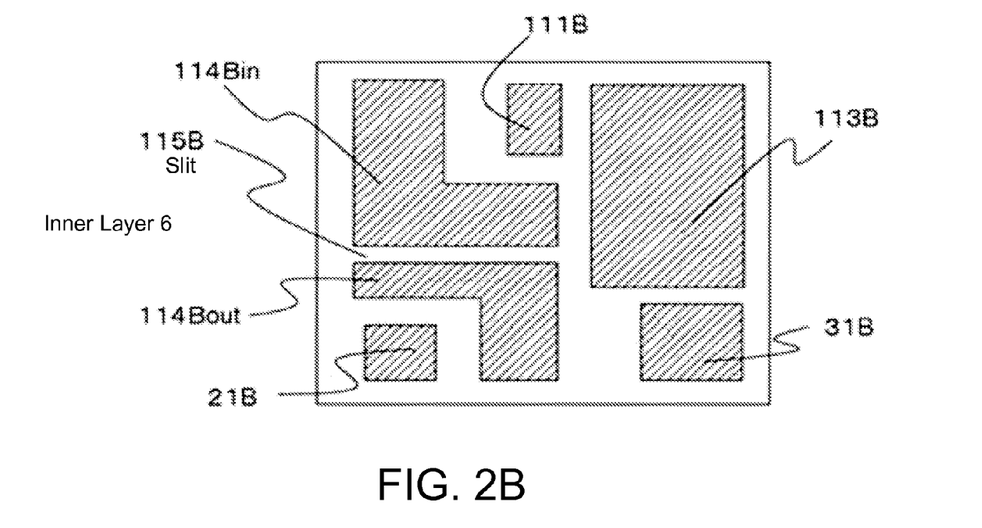
Figure 2C:
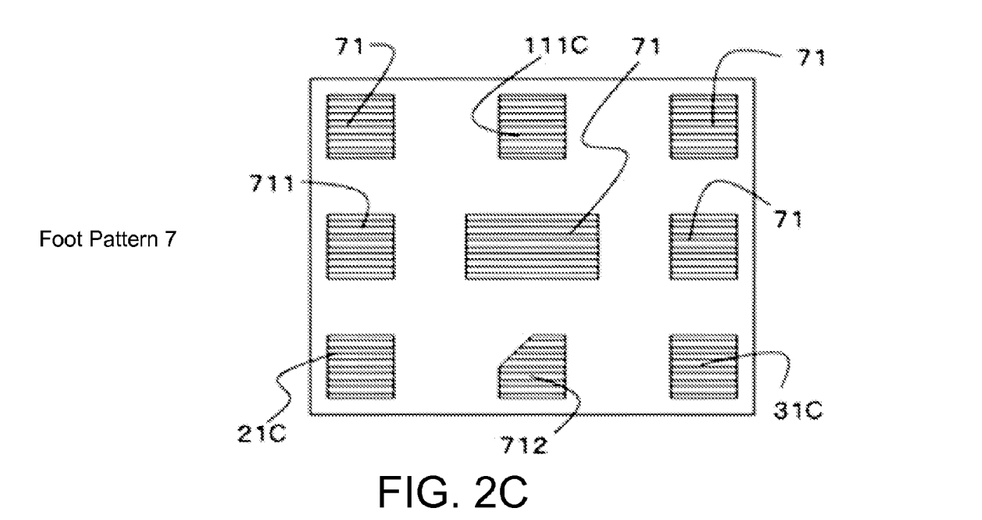

FIGS. 2A to 2C are drawings for describing the patterns of the respective layers in the package substrate of the duplexer of Embodiment 1. The patterns of the respective layers are layered, while sandwiching each substrate therebetween, and overlap with each other. Therefore, the inner layer 6 shown in FIG. 2B and the foot pattern 7 shown in FIG. 2C are patterns as seen from the die attach layer 5 side shown in FIG. 2A in a transparent view. The elements shown in FIG. 2A may include A in the reference characters thereof, elements shown in FIG. 2B may include B in the reference characters thereof, and the elements shown in FIG. 2C may include C in the reference characters thereof. As shown in FIG. 2A, a die attach layer 5 and a seal ring part 10 are formed on a surface (upper surface) of the first substrate 11. An antenna terminal 111A, a parallel resonator ground terminal 112A of the receiving filter 2, a parallel resonator ground terminal 113A of the transmitting filter 3, a receiving terminal 21A, and a transmitting terminal 31A are formed in the die attach layer 5. In addition, a ground terminal 114A of the double-mode filter is formed. Embodiment 1 shows an example in which a double mode SAW filter (hereinafter referred to as DMS) is used as the double-mode filter. The parallel resonator ground terminal 112A of the receiving filter 2 and the ground terminal 114A of the DMS are formed so as to be separate. The input ground and the output ground of the DMS are formed so as to be at the same potential in the common ground terminal 114A. In other words, they are formed in a continuous pattern and form a common ground. Here, the fact that the input ground and the output ground of the DMS form a common ground in the die attach layer 5 is shown with the reference character 114A in FIG. 5. 114A and 112A are formed so as to be separate in the die attach layer 5. With this configuration, the ground inductances of the parallel resonator ground and the common ground of the input and output of the DMS can each be adjusted separately.

As shown in FIG. 2B, an antenna terminal 111B, a parallel resonator ground terminal 113B of the transmitting filter 3, an input-side ground terminal 114Bin of the DMS, an output-side ground terminal 114Bout of the DMS, a receiving terminal 21B, and a transmitting terminal 31B are formed in the inner layer 6 disposed between the first substrate 11 and the second substrate 12. Here, the parallel resonator ground terminal 112A of the receiving filter 2 in the die attach layer 5 is electrically connected to the input-side ground terminal 114Bin of the DMS in the inner layer 6 through a via that penetrates the first substrate 11, and both grounds are formed together in the inner layer 6, but the grounds may be formed separately. Here, the input ground and the output ground of the DMS correspond to 114Bin and 114Bout of FIG. 5, respectively, and 114Bin and 112 are formed to have a common ground in the inner layer 6 as described above. The input-side ground terminal 114Bin and the output-side ground terminal 114Bout of the DMS are formed separately by a slit 115B formed so as to intersect at a substantially right angle to the direction in which the terminals are disposed. With this configuration, it is possible to prevent the received signal from the antenna terminal 111C of the foot pattern 7 for external connections, which will be described below, from leaking to the receiving terminal 21B and the like through the ground pattern of the DMS in the inner layer due to capacitive coupling, and it is thus possible to prevent a deterioration of isolation characteristics. In particular, if the second substrate 12 is thinner than the first substrate 11 as in the present embodiment, the deterioration of isolation characteristics caused by the capacitive coupling due to the pattern of the inner layer 6 is more severe than the deterioration of isolation characteristics caused by the capacitive coupling resulting from the die attach layer 5 and the seal ring part 10. Thus the effect of separating the input and output grounds of the DMS in the inner layer 6 is great. In the present embodiment, the width of the slit in the direction in which the terminals are disposed is 75 μm. Also, the slit can be formed in various forms such as diagonally, in a zigzag pattern, in a wave pattern, or with different widths, for example, as long as it can separate the input ground pattern and the output ground pattern of the DMS.

Figure 7:
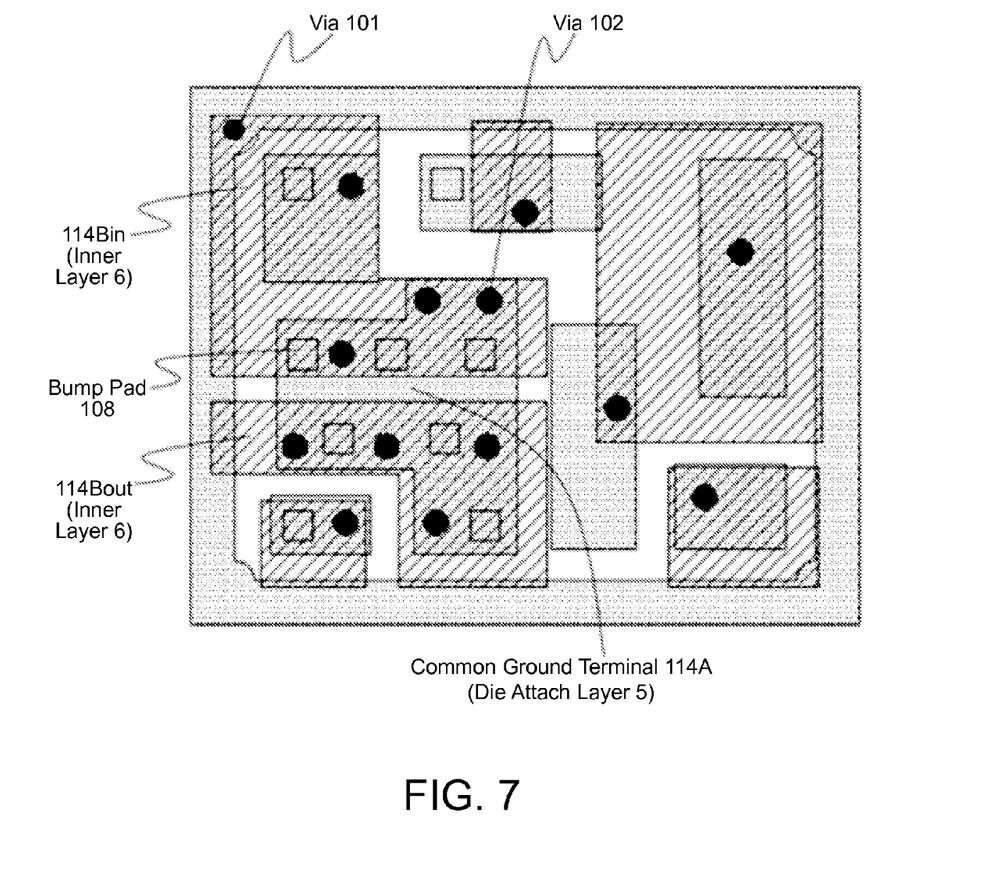
FIG. 7 is a drawing for describing the characteristics of a duplexer according to Embodiment 2 of the present invention.

The ground path, or in other words where most of the electricity flows, tends to be the shortest path, and therefore, even if the ground is shared at the die attach layer 5, most of the current will flow into the respective vias closest to the bumps connected to the ground terminal. Thus, by disposing vias near the respective bumps of the input and output ground terminals of the DMS, most of the current flows to the nearer vias, respectively, and by separating the pattern in the inner layer 6, which is the layer therebelow, it is possible to adjust the ground inductances of the input and the output, respectively. Also, while most of the current takes the shortest path, because the ground is shared in the die attach layer 5, some of the current flows to vias that are further from the input and output, and this current forms the common ground inductance. By adjusting the location of the vias, the pattern layout, or the like using normal design methods, it is possible to obtain a desired ground inductance. FIG. 7 shows where vias 102, which connect the die attach layer 5 to the inner layer 6, are disposed in Embodiment 1. The configuration of FIG. 7 is made clearer in a later description, but in the ground patterns 114A, 114Bin, and 114Bout of the DMS, the current flowing from the bump pads 108 in that region to the nearby vias 102 constitutes most of the ground inductance components of each input/output ground, and the current flowing to the vias 102 located further away constitutes most of the ground inductance components of the common ground 114A. Thus, with the configuration in which the input and output grounds of the DMS are formed as a common ground in the die attach layer 5, and the input and output grounds are separated in the inner layer 6, the isolation between the antenna and the receiving terminal can be secured while allowing the inductances of the input/output grounds and the common ground of the DMS to be independently adjusted.

As shown in FIG. 2C, on a surface (lower surface) of the second substrate 12, an antenna terminal 111C, a receiving terminal 21C, a transmitting terminal 31C, and ground terminals 71, 711, and 712 are formed as the foot pattern 7. When using the receiving filter 2 with balanced output, 711 or 712 is used as the second receiving terminal in addition to the first receiving terminal 21C. In order to increase the isolation characteristics from the transmitting terminal 31C, it is preferable that 711, which is further from the transmitting terminal 31C than from 712, be used as the second receiving terminal.

Figure 3:
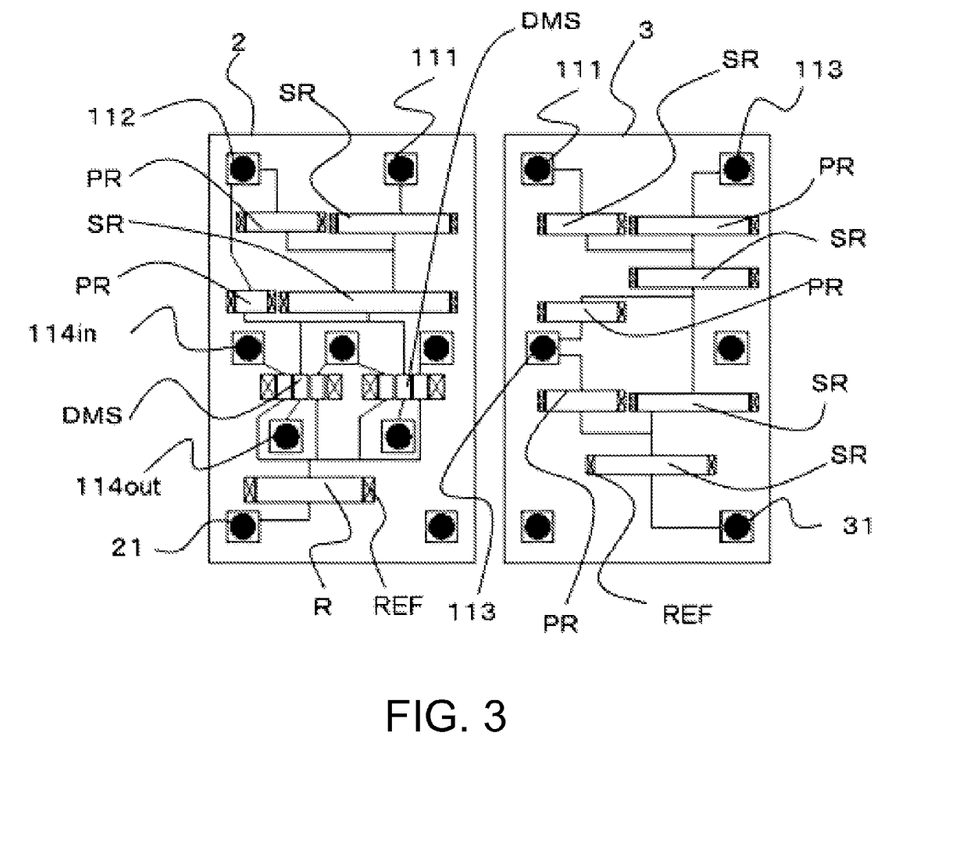
FIG. 3 is a drawing for describing a receiving filter and a transmitting filter used in the duplexer of Embodiment 1.
Figure 5:
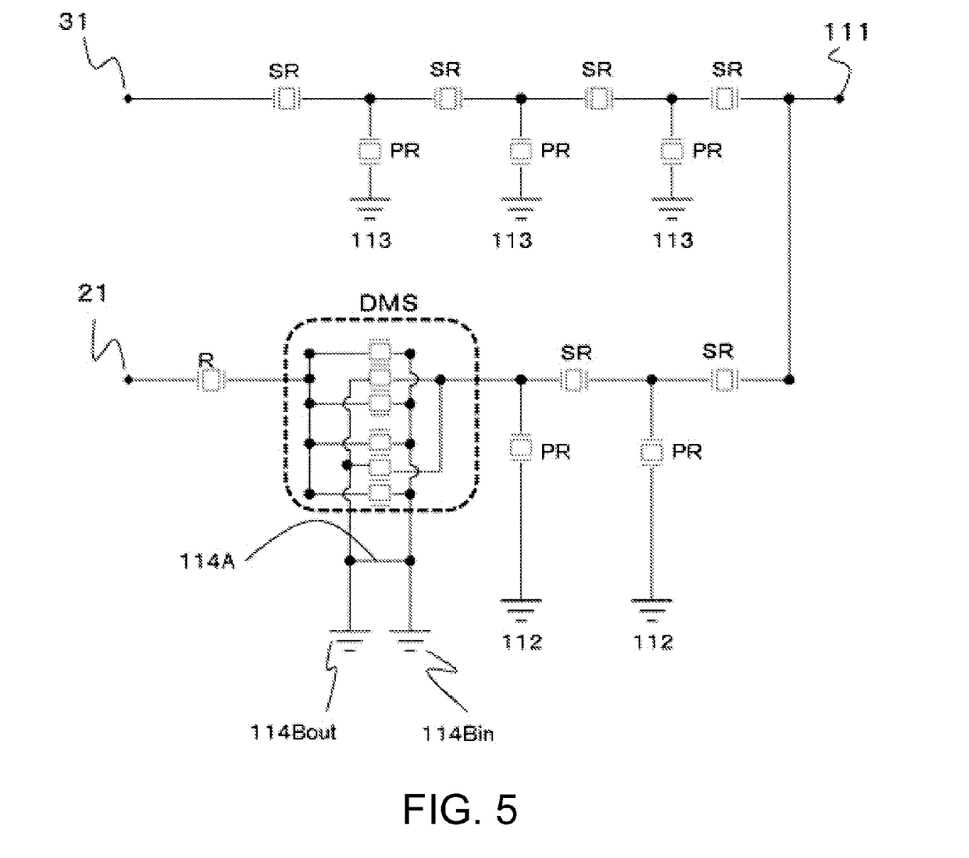
FIG. 5 is a drawing that shows an equivalent circuit of the duplexer of Embodiment 1.

FIG. 3 is a drawing for describing the receiving filter 2 and the transmitting filter 3 used in the duplexer according to Embodiment 1. FIG. 3 is a drawing that shows a configuration of functional elements made of surface acoustic wave resonators viewed from the rear of the filter chip (the side opposite to where the functional element is formed) in a transparent view. FIG. 5 is an equivalent circuit diagram of the duplexer according to Embodiment 1. In FIGS. 3 and 5, the same components are assigned the same reference characters. The structure and circuit configuration of the duplexer according to Embodiment 1 will be described below with reference to FIGS. 3 and 5. The receiving filter 2 is constituted of a DMS that is divided into a plurality of parallel parts (two in the present embodiment), a ladder filter constituted of a plurality of series resonators SR and a plurality of parallel resonators PR connected between the DMS and the antenna terminal 111, and a resonator R connected between the DMS and the receiving terminal 21. The receiving filter 2 is designed such that of the signal inputted from the antenna terminal 111, a signal of a desired passband is outputted from the receiving terminal 21. By separating the DMS into a plurality of parallel parts, a filter with a high withstand voltage and low insertion loss even in higher frequencies can be attained, but a DMS that is not divided into a plurality of parallel parts may be used. The parallel resonators PR are grounded by the ground terminal 112. The input ground terminal and the output ground terminal of the DMS are each grounded via the ground terminal 114. In other words, the input-side ground terminal 114in of the DMS is connected to the ground terminal 114A via three bumps, and the output-side ground terminal 114out is connected to the ground terminal 114A via two bumps. The ground terminal 114A is divided into the ground terminals 114Bin and 114Bout in the inner layer 6 connected through the vias 102, and extends therein.

Figures 4A, 4B:
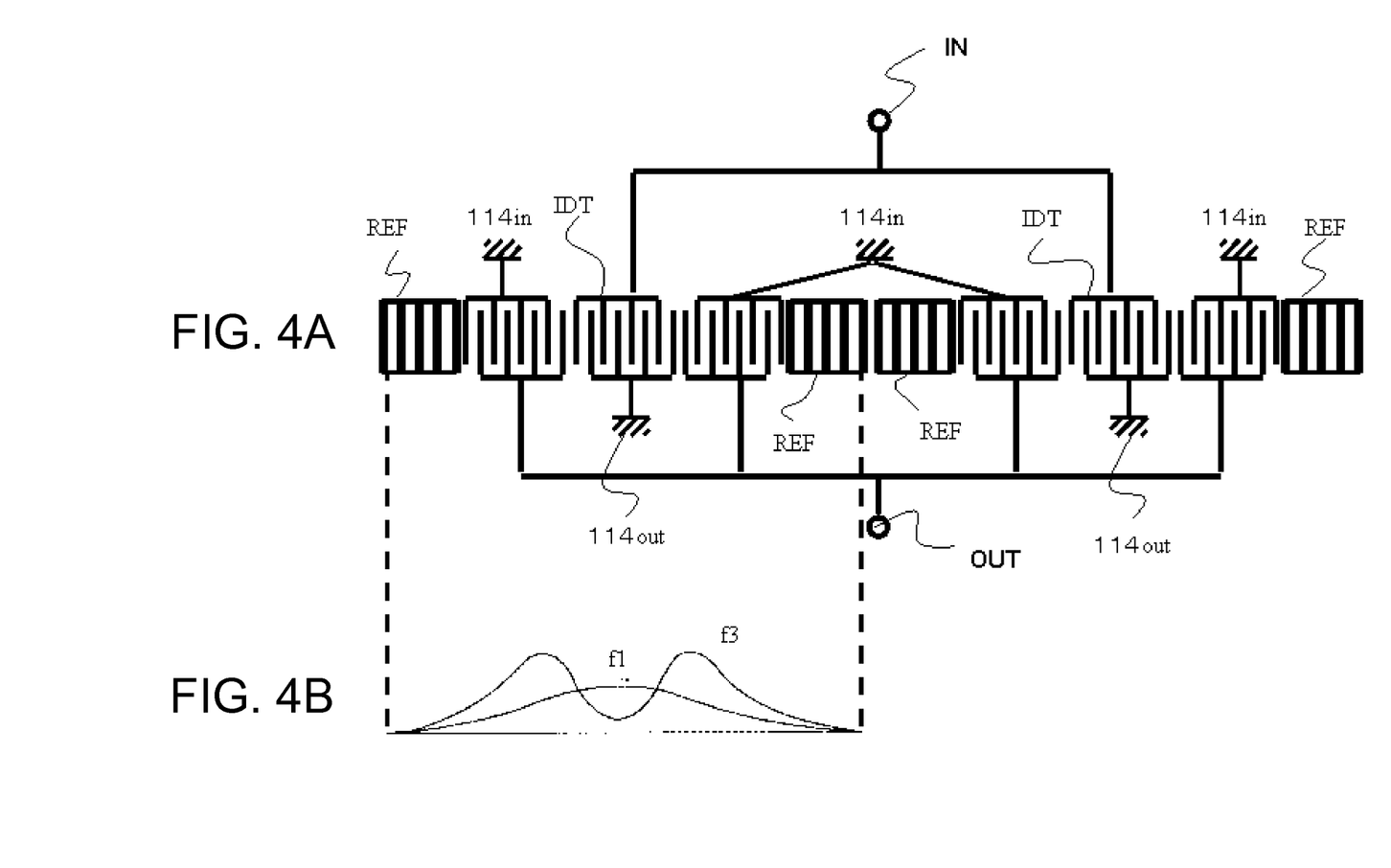
FIGS. 4A-4B are drawings that show DMSs included in a receiving filter 2 of Embodiment 1.

FIG. 4 is a drawing that shows the DMSs included in the receiving filter 2 according to Embodiment 1. The two DMSs, each of which is provided with three IDTs between a pair of reflectors formed on a piezoelectric substrate (not shown in drawings) made of a lithium tantalite monocrystalline plate or the like, are connected in parallel. By connecting a plurality of DMSs in parallel, the withstand voltage can be increased and a worsening of insertion losses can be prevented even with high frequencies. As shown in FIG. 4, the DMSs use a first order mode with a frequency f1 and a third order mode with a frequency f3 formed between two reflectors REF that sandwich the three IDTs, and realize passband characteristics that have a passband formed by double resonance of the frequencies f1 and f3, such as the receiving band shown in FIG. 8. FIG. 4B schematically shows the energy distribution of surface acoustic waves in one DMS in the structure shown in FIG. 4A.

The transmitting filter 3 shown in FIG. 3 is constituted of a ladder filter constituted of a plurality of series resonators SR and a plurality of parallel resonators PR connected between the transmitting terminal 31 and the antenna terminal 111. The parallel resonators PR are grounded via the ground terminal 113. The transmitting filter 3 is designed such that of the signal inputted from the transmitting terminal 31, a signal of a desired passband is outputted from the antenna terminal 111.

The surface acoustic wave resonators that constitute the receiving filter 2 and the transmitting filter 3 are each provided with reflectors REF on both sides of the IDT. With this configuration, a leak of surface acoustic waves can be prevented, which makes possible a reduction in loss and the like. Also, the parallel resonators PR are respectively grounded via the ground terminals 112 and 113. The input side and output side of the DMS in the receiving filter 2 are also grounded via the ground terminals 114in and 114out, respectively. The ladder filter may be a one-step ladder filter constituted of one series resonator and one parallel resonator. The receiving filter 2 and the transmitting filter 3 are formed by forming IDTs, reflective electrodes, and wiring lines made of a metal layer using a film-forming technique such as the sputtering method or the vapor deposition method on a piezoelectric substrate, along with a patterning technique such as photolithography. The metal layer may be formed with aluminum (Al) as a main component, for example, and may include copper (Cu), for example. Also, the ladder filter in the transmitting filter 3 may be formed using an FBAR. An FBAR is advantageous for use in higher frequency bands due to the characteristics thereof. An FBAR is constituted of a lower electrode, a piezoelectric film made of aluminum nitride or the like, and an upper electrode layered in this order, and functions as a resonator due to the regions where these layers overlap vibrating. Because the overlapping regions vibrate, it is generally necessary to secure a space between the FBAR and the supporting substrate, but a method that prevents vibrations from spreading such as an acoustic mirror may be used.

Figure 6:
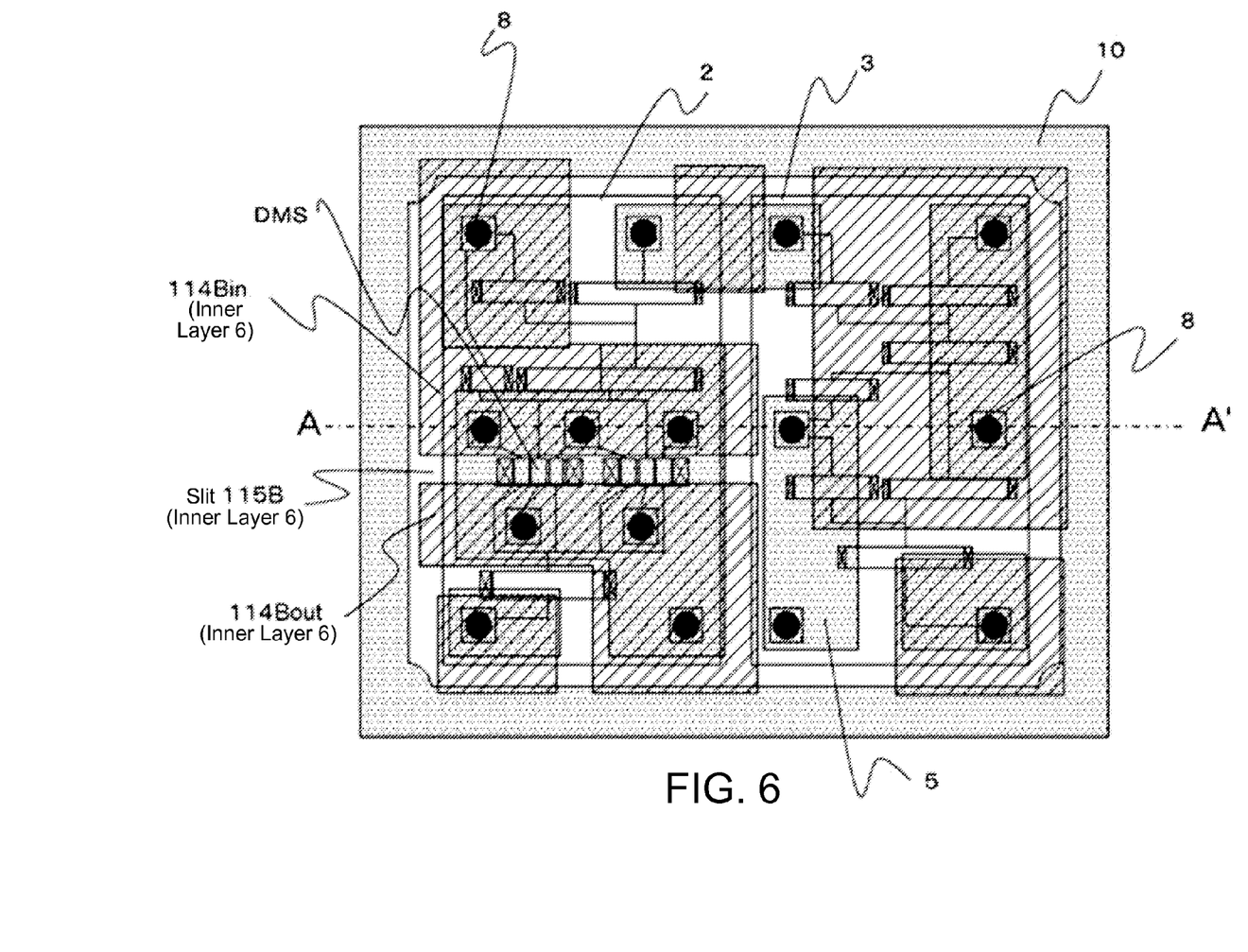
FIG. 6 is a drawing that shows the overlap of a slit and a double-mode filter of the duplexer of Embodiment 1.

FIG. 6 is a drawing that shows the overlap of the slit 115B and the DMS of the duplexer of Embodiment 1. In order to aid understanding of the positional relations of the components of the receiving filter 2, the transmitting filter 3, the die attach layer 5, and the inner layer 6, FIG. 6 shows a transparent view in which the die attach layer 5 in FIG. 2A and the inner layer 6 shown in FIG. 2B are superimposed on FIG. 3. The regions shown with a diagonal line hatching pattern represent the patterns of the inner layer 6, and the dotted regions represent the patterns of the die attach layer 5 and the seal ring part 10. When viewing the package substrate 1 from above (from the side on which the filter is mounted by the flip chip method) in a transparent view, the regions where the hatching pattern and the dotted pattern overlap are the regions where the die attach layer 5, the seal ring part 10, and the inner layer 6 overlap through the first substrate. When viewing the overlapping relation between the receiving filter 2 chip functional elements and the inner layer 6, it can be seen that at least a portion of the DMS overlaps with the slit 115B of the inner layer 6. Generally, increasing the size of the ground inductance can be done with ease through various methods but making it smaller is difficult due to the design of the ground inductance. Thus, from a design perspective, it is preferable that the ground inductance is already at a minimum size unless a large ground inductance is specifically desired. In a configuration in which at least a portion of the DMS overlaps with the slit 115B of the inner layer 6, it is possible to minimize the number of wiring lines, thereby preventing an unwanted increase in ground inductance and improving the space efficiency of the filter chip from a wiring line design perspective, thus increasing the design flexibility of where the ground pads are disposed on the filter chip. As a result, the chip layout can be adjusted with ease so as to keep the inductances of the input/output grounds of the DMS at an appropriate level. Below, the reasons thereof are described with reference to FIGS. 6 and 7.

FIG. 7 omits the filters and the bumps from FIG. 6, and shows a via 101 for electrically connecting the inner layer 6 to the seal ring part 10, a plurality of vias 102 for electrically connecting the inner layer 6 to the die attach layer, and bump pads 108. In the present embodiment, the diameter of the via 101 that electrically connects the inner layer 6 to the seal ring part 10 is 60 μm and the diameter of each of the plurality of vias 102 that electrically connect the inner layer 6 to the die attach layer is 75 μm. Also, connective regions where bumps are connected to the die attach layer 5 when the filters are mounted by the flip chip method are shown as the bump pads 108. Other components in FIG. 7 are similar to those in FIG. 6. Here, the ground path (path of current flow) tends to be the shortest path, and thus, in order to separate the input ground and the output ground of the DMS in the inner layer 6 and prevent an unwanted increase in ground inductance, the locations where the input-side ground terminal 114in and the output-side ground terminal 114out of the DMS of the receiving filter and the die attach layer 5 are electrically connected to each other need to be directly above the input-side ground terminal 114Bin and the output-side ground terminal 114Bout of the inner layer 6, respectively.

Conversely, if the DMS is disposed in a location that does not overlap with the slit, the wiring line from the DMS to the input or output ground terminal of the DMS on the receiving filter 2 chip needs at least to be long enough to extend beyond the slit in order to dispose the input-side ground terminal 114in and the output-side ground terminal 114out of the DMS directly above the input-side ground terminal 114Bin and the output-side ground terminal 114Bout of the inner layer 6, which increases the ground inductance. Another possibility is that the lengths of the wiring lines for connecting the die attach layer 5 to the respective ground terminals 114Bin and 114Bout of the inner layer 6 become unbalanced, causing an increase in ground inductance in the shortest path side (114Bin or 114Bout) due to the current concentration, and in the other path (114Bout or 114Bin) due to the long wiring length. Thus, if the DMS is disposed in a location that does not overlap with the slit, the space efficiency worsens and an unwanted increase in ground inductance due to ground wiring lines is more likely.

Due to the above reasons, in a configuration in which at least a portion of the DMS overlaps with the slit 115B of the inner layer 6, because the length of the wiring lines can be minimized, an unwanted increase in ground inductance is prevented, and the space efficiency of the filter chip from a wiring line design perspective is improved. As a result, the design flexibility of where the ground pads are disposed on the filter chip can be increased, which allows the chip layout for bringing the inductances of the input/output grounds of the DMS to an appropriate level to be adjusted with ease. Also, in the present embodiment, the lengthwise direction of the slit 115B is the same as the direction in which the DMSs, which are separated and parallel, are disposed. By using a design in which these directions are the same, the space efficiency is further improved.

With FIG. 6, it is possible to understand that the terminals 21, 31, 111, 112, 113, 114in, and 114out shown in FIG. 3, are electrically connected to the patterns 21A, 31A, 111A, 112A, 113A, and 114A of the die attach layer 5 shown in FIG. 2A via the bumps 8. Also, each of the bumps 8 of the receiving filter 2 is disposed so as to overlap with at least a portion of the patterns of the inner layer 6. In the present embodiment, all bumps 8 aside from that connected to the antenna terminal 111 overlap with the patterns of the inner layer 6. With this configuration, it is possible to mitigate variations in interlayer coupling capacitance due to layer offset in the package substrate, thus keeping variations in characteristics to a minimum and improving coplanarity. In addition, each of the bumps 8 for connecting the ground terminals overlaps with at least a portion of the ground patterns of the inner layer 6, but does not overlap with the slit 115B. In the present embodiment, the bumps 8 for connecting all of the ground terminals overlap with the ground patterns of the inner layer 6. In particular, there are a plurality of bumps 8 for connecting the input/output ground terminals of the DMS, and these bumps 8 are disposed at a high density. In the present embodiment, there are three bumps for connecting the input ground terminal of the DMS, and two bumps for connecting the output ground terminal of the DMS. Also, when considering the fact that a plurality of vias, which cause a deterioration of coplanarity, are often interposed between the die attach layer 5 and the inner layer 6 in order to strengthen the ground, it is preferable that the bumps 8 for connecting the input/output ground terminals of the DMS all be disposed in regions where the die attach layer 5 and the inner layer 6 overlap so as to prevent a deterioration of coplanarity.

Embodiment 2

As shown in FIG. 7, in a duplexer according to Embodiment 2, a seal ring part 10, which surrounds functional elements, and an input-side ground terminal 114Bin of inner layer 6 patterns are electrically connected through a via 101. According to this configuration, electromagnetic shielding effects can be attained using the seal ring part 10, thus decreasing the susceptibility to external interference by other electronic parts and the like during use. In addition, by making the sealing member 4 of a conductive material such as solder, the shielding effect is further increased. FIG. 7 shows an example in which the seal ring part 10 and the ground of the receiving filter 2 are electrically connected, but it is possible to electrically connect only the ground of the transmitting filter 3 to the seal ring part 10, or to have the seal ring part 10 be electrically connected to the grounds of both the transmitting and receiving filters. Other components are similar to those of the duplexer of Embodiment 1, and thus, the descriptions thereof are omitted.

Figure 8:
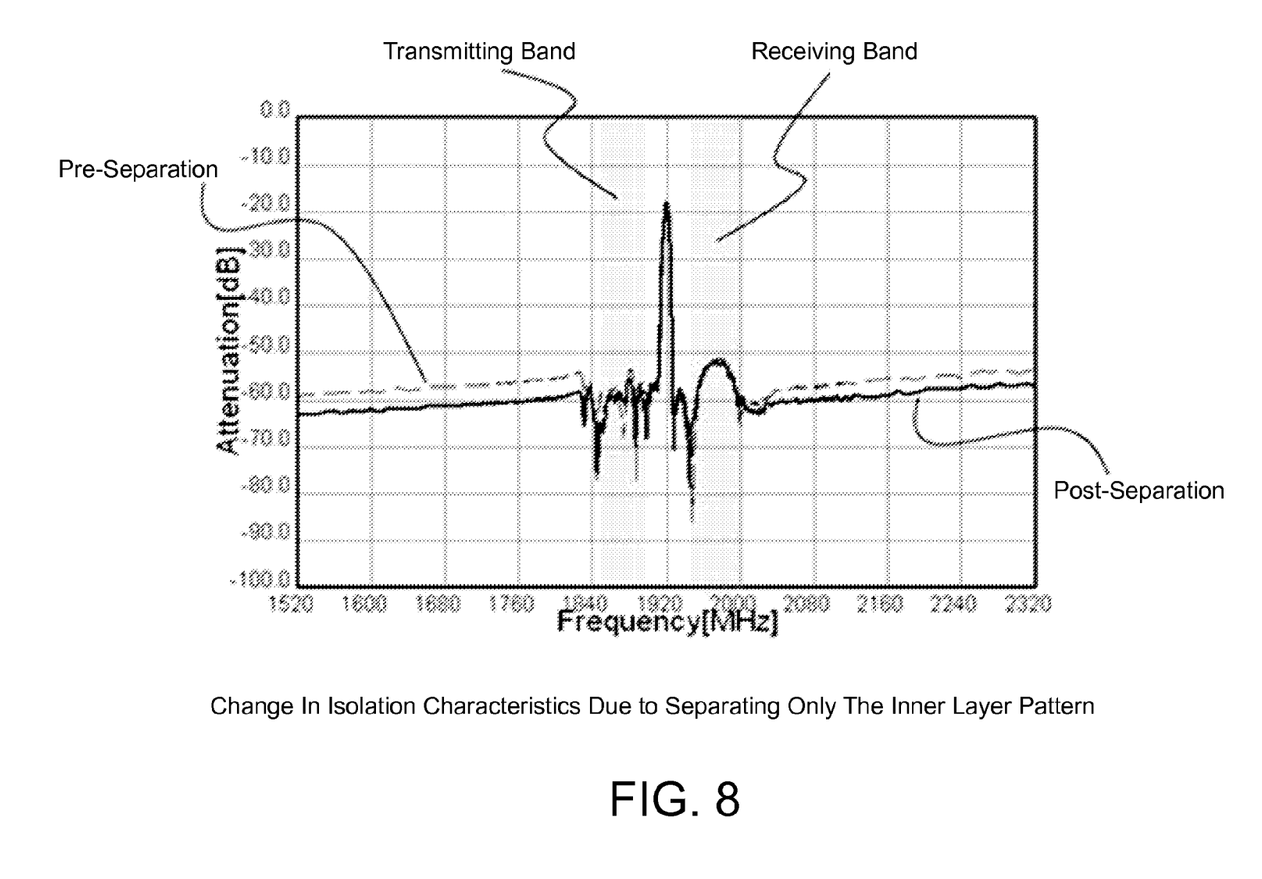
FIG. 8 is a drawing that shows the characteristics of the duplexer of Embodiment 2.

FIG. 8 is a drawing that shows the characteristics of the duplexer according to Embodiment 2. The transmitting band is set to 1850 to 1910 MHz, and the receiving band is set to 1930 to 1990 MHz. When comparing a case in which the input/output grounds of the DMS of the receiving filter 2 are formed as a common ground (pre-separation) in the inner layer 6 to a case in which the input side ground terminal 114Bin and the output-side ground terminal 114Bout of the DMS of the receiving filter 2 are formed separately (post-separation) in the inner layer 6, it can be seen that the isolation characteristics are improved with the latter case.

DESCRIPTION OF REFERENCE CHARACTERS

1 package substrate
2 receiving filter
3 transmitting filter
4 sealing member
5 die attach layer
6 inner layer
7 foot pattern
9 gap
10 seal ring part
11 first substrate
12 second substrate
21 receiving terminal
31 transmitting terminal
71 ground terminal
101, 102 via
111 antenna terminal
112 parallel resonator ground terminal of receiving filter 2
113 parallel resonator ground terminal of transmitting filter 3
114 ground terminal of DMS
115B slit

The invention claimed is:
1. A duplexer, comprising:
a transmitting filter connected between an antenna terminal and a transmitting terminal;
a receiving filter disposed between the antenna terminal and a receiving terminal, the receiving filter including a double-mode filter having an input ground and an output ground;
a package substrate that has a first substrate, a die attach layer that is patterned onto the first substrate, a second substrate that faces the first substrate, and an inner layer located between the first substrate and the second substrate, the die attach layer being on a first side of the first substrate opposite to a second side facing the second substrate, the receiving filter being mounted on the die attach layer on the first substrate, the receiving filter being thereby provided over the first substrate on the first side opposite to the second side of the first substrate facing the second substrate;
a common ground terminal in the die attach layer, said common ground terminal being in contact with the input ground and the output ground of the double-mode filter so that the input ground and the output ground are commonly grounded;
an input-side ground terminal of the input ground of the double-mode filter, the input-side ground terminal constituting a portion of the inner layer; and an output-side ground terminal of the output ground of the double-mode filter, the output-side ground terminal being formed separately from the input-side ground terminal and constituting a portion of the inner layer.

2. The duplexer according to claim 1, wherein the input-side ground terminal and the output-side ground terminal of the double-mode filter in the inner layer are separated by a slit.

3. The duplexer according to claim 1, wherein the double-mode filter is divided into a plurality of parallel parts.

4. The duplexer according to claim 1, wherein the receiving filter further includes a ladder filter provided with a series resonator and a parallel resonator, and a ground of the parallel resonator and the input/output ground of the double-mode filter are separate in the die attach layer.

5. The duplexer according to claim 1,
wherein the receiving filter is mounted on the die attach layer on the first substrate through a plurality of bumps,
wherein said common ground terminal is in contact with the input ground and the output ground of the double-mode filter via some of said plurality of bumps,
wherein the input-side ground terminal is connected to the common ground terminal in the die attach layer through one or more of vias that penetrate through the first substrate, and
wherein the output-side ground terminal being connected to the common ground terminal in the die attach layer through one or more of vias that penetrate through the first substrate.

6. The duplexer according to claim 1, further comprising a seal ring part formed on an outer edge of the first substrate,
wherein the seal ring part has a common ground with a ground of the transmitting filter and/or the input/output ground of the receiving filter.

7. The duplexer according to claim 1, further comprising a seal ring part formed on an outer edge of the first substrate,
wherein the seal ring part is electrically independent of a ground of the transmitting filter and the input/output ground of the receiving filter.

8. The duplexer according to claim 1, wherein the receiving filter has a balanced output.

9. A duplexer, comprising:
a transmitting filter connected between an antenna terminal and a transmitting terminal;
a receiving filter disposed between the antenna terminal and a receiving terminal;
a package substrate that has a first substrate, a die attach layer that is patterned onto the first substrate, a second substrate, and an inner layer located between the first substrate and the second substrate;
a double-mode filter that constitutes a portion of the receiving filter;
a common ground terminal that makes an input ground and an output ground of the double-mode filter commonly grounded, the common ground terminal constituting a portion of the die attach layer;
an input-side ground terminal of the input ground of the double-mode filter, the input-side ground terminal constituting a portion of the inner layer; and
an output-side ground terminal of the output ground of the double-mode filter, the output-side ground terminal being formed separately from the input-side ground terminal and constituting a portion of the inner layer;
wherein the input-side ground terminal and the output-side ground terminal of the double-mode filter in the inner layer are separated by a slit, and
wherein the double-mode filter is disposed so as to overlap with at least a portion of the slit.

10. The duplexer according to claim 9, wherein the receiving filter further includes a ladder filter provided with a series resonator and a parallel resonator, and a ground of the parallel resonator and the input/output ground of the double-mode filter are separate in the die attach layer.

11. The duplexer according to claim 9, wherein the double-mode filter is divided into a plurality of parallel parts.

12. The duplexer according to claim 9, further comprising a seal ring part formed on an outer edge of the first substrate,
wherein the seal ring part has a common ground with a ground of the transmitting filter and/or the input/output ground of the receiving filter.

13. The duplexer according to claim 9, further comprising a seal ring part formed on an outer edge of the first substrate,
wherein the seal ring part is electrically independent of a ground of the transmitting filter and the input/output ground of the receiving filter.

14. The duplexer according to claim 9, wherein the receiving filter has a balanced output.

15. A duplexer, comprising:
a transmitting filter connected between an antenna terminal and a transmitting terminal;
a receiving filter disposed between the antenna terminal and a receiving terminal;
a package substrate that has a first substrate, a die attach layer that is patterned onto the first substrate, a second substrate, and an inner layer located between the first substrate and the second substrate;
a double-mode filter that constitutes a portion of the receiving filter;
a common ground terminal that makes an input ground and an output ground of the double-mode filter commonly grounded, the common ground terminal constituting a portion of the die attach layer;
an input-side ground terminal of the input ground of the double-mode filter, the input-side ground terminal constituting a portion of the inner layer; and
an output-side ground terminal of the output ground of the double-mode filter, the output-side ground terminal being formed separately from the input-side ground terminal and constituting a portion of the inner layer;
wherein the input-side ground terminal and the output-side ground terminal of the double-mode filter in the inner layer are separated by a slit,
wherein the receiving filter has bumps for connecting to the input-side ground terminal/output-side ground terminal, and the bumps for connecting to the input-side ground terminal/output-side ground terminal overlap with at least a portion of the input-side ground terminal or the output-side ground terminal, and
wherein the bumps for connecting to the input-side ground terminal/output-side ground terminal do not overlap with the slit.

16. The duplexer according to claim 15, wherein the double-mode filter is divided into a plurality of parallel parts.

17. The duplexer according to claim 15, further comprising a seal ring part formed on an outer edge of the first substrate,
wherein the seal ring part has a common ground with a ground of the transmitting filter and/or the input/output ground of the receiving filter.

18. The duplexer according to claim 15, further comprising a seal ring part formed on an outer edge of the first substrate,
wherein the seal ring part is electrically independent of a ground of the transmitting filter and the input/output ground of the receiving filter.

19. The duplexer according to claim 15, wherein the receiving filter has a balanced output.

20. The duplexer according to claim 15, wherein the receiving filter further includes a ladder filter provided with a series resonator and a parallel resonator, and a ground of the parallel resonator and the input/output ground of the double-mode filter are separate in the die attach layer.

\* \* \* \* \*